(12) United States Patent
Hsu et al.

(10) Patent No.: US 10,991,841 B2
(45) Date of Patent: Apr. 27, 2021

(54) PEROVSKITE SOLAR CELL AND TANDEM SOLAR CELL

(71) Applicant: Industrial Technology Research Institute, Hsinchu (TW)

(72) Inventors: Hung-Ru Hsu, Changhua County (TW); Kai-Cheng Wang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 38 days.

(21) Appl. No.: 16/209,970

(22) Filed: Dec. 5, 2018

(65) Prior Publication Data
US 2019/0181290 A1    Jun. 13, 2019

(30) Foreign Application Priority Data

Dec. 13, 2017   (TW) ................................. 106143699

(51) Int. Cl.
*H01L 31/0725* (2012.01)
*H01L 31/0224* (2006.01)
(Continued)

(52) U.S. Cl.
CPC ........ *H01L 31/0725* (2013.01); *H01L 27/302* (2013.01); *H01L 31/022425* (2013.01);
(Continued)

(58) Field of Classification Search
CPC . H01L 27/302; H01L 31/043; H01L 31/0725; H01L 51/442; H01L 31/022425; H01L 31/022466; H01L 51/445; H01L 51/426; H01L 51/4266; H01L 51/4273; H01L 51/4226; H01L 51/4246; H01L 51/0037; H01L 51/0047; H01G 9/2027
(Continued)

(56) References Cited

U.S. PATENT DOCUMENTS

| 2002/0028382 A1 | 3/2002 | Sunagawa et al. |
| 2010/0102450 A1* | 4/2010 | Narayan ............... H01L 51/442 257/763 |

(Continued)

FOREIGN PATENT DOCUMENTS

| CN | 103311440 | 9/2013 |
| CN | 105024013 | 11/2015 |

(Continued)

OTHER PUBLICATIONS

Jeng etal, CH3NH3Pbl3 Perovskite/Fullerene Planar-Heterojunction Hybrid Solar Cells, 2013, Adv. Mater. 25, 3727-3732. (Year: 2013).*

(Continued)

*Primary Examiner* — Andrew J Golden
(74) *Attorney, Agent, or Firm* — JCIPRNET

(57) ABSTRACT

A perovskite solar cell and a tandem solar cell are provided. The perovskite solar cell includes a perovskite light-absorbing layer, a first electrode and a second electrode. The first electrode is disposed on a first surface of the perovskite light-absorbing layer. The second electrode is disposed on a second surface of the perovskite light-absorbing layer. The first electrode includes a transparent electrode made of metal-doped molybdenum oxide, and the doped metal is niobium (Nb) or manganese (Mn).

22 Claims, 4 Drawing Sheets

(51) Int. Cl.
| | |
|---|---|
| H01L 51/00 | (2006.01) |
| H01L 51/44 | (2006.01) |
| H01L 31/043 | (2014.01) |
| H01L 27/30 | (2006.01) |
| H01L 51/42 | (2006.01) |

(52) U.S. Cl.
CPC .... *H01L 31/022466* (2013.01); *H01L 31/043* (2014.12); *H01L 51/0037* (2013.01); *H01L 51/0047* (2013.01); *H01L 51/442* (2013.01); *H01L 51/4226* (2013.01); *H01L 51/4246* (2013.01)

(58) Field of Classification Search
USPC .................................................. 136/243–265
See application file for complete search history.

(56) References Cited

U.S. PATENT DOCUMENTS

| | | | |
|---|---|---|---|
| 2011/0068327 A1* | 3/2011 | Morishima | H01L 51/5052 257/40 |
| 2016/0035927 A1 | 2/2016 | Gershon et al. | |
| 2016/0226011 A1* | 8/2016 | Nazeeruddin | H01L 51/4213 |
| 2017/0054100 A1* | 2/2017 | De Vries | H01L 51/56 |
| 2017/0316847 A1* | 11/2017 | Hitosugi | C04B 35/62218 |
| 2018/0016456 A1* | 1/2018 | Wang | C09D 11/106 |

FOREIGN PATENT DOCUMENTS

| | | | | |
|---|---|---|---|---|
| CN | 105493304 | | 4/2016 | |
| CN | 107210134 | | 9/2017 | |
| TW | I452929 | | 9/2014 | |
| TW | 201620838 | | 6/2016 | |
| WO | WO-2016095828 A1 * | 6/2016 | | C08L 65/00 |
| WO | WO-2016115602 A1 * | 7/2016 | | H01L 27/302 |

OTHER PUBLICATIONS

Mahmoodi et al, Structural Effects of Substitutional Impurities on MoO3 Bilayers: A First Principles Study, 2016, Journal of the Korean Physical Society, vol. 69, No. 9, pp. 1439-1444 (Year: 2016).*

Kyaw et al, An inverted organic solar cell employing a sol-gel derived ZnO electron selective layer and thermal evaporated hole selective layer, 2008, Appl. Phys. Lett. 93, 221107, pp. 1-3 (Year: 2008).*

Jung et al, BCP/Ag/MoO3 Transparent Cathodes for Organic Photovoltaics, 2011, Adv. Energy Mater., 1, 1023-1028 (Year: 2011).*

Mahajan et al, Structural, optical and electrochromic properties of Nb-doped MoO3 thin films, 2008, Applied Surface Science, 254, 5895-5898 (Year: 2008).*

Dr. Q. Jeangros, "Photovoltaics and Thin Film Electronics Laboratory PVLAB," Dec. 2018, Available at: http://pvlab.epfl.ch/page-124775-en.html.

L. Meng et al, "Recent advances in the inverted planar structure of perovskite solar cells,"American Chemical Society, vol. 49, 2016, pp. 155-165.

C.D. Bailie et al, "Semi-transparent perovskite solar cells for tandems with silicon and CIGS,"Energy Environ. Sci., vol. 8, 2015, pp. 956-963.

P. Löper et al, "Organic-inorganic halide perovskite/crystalline silicon four-terminal tandem solar cells,"Physical Chemistry Chemical Physics, vol. 17, 2015, pp. 1619-1629.

R. Asadpour et al, "Bifacial Si heterojunction-perovskite organic-inorganic tandem to produce highly efficient (nT*~33%) solar cell,"Applied Physics Letters, vol. 106, 2015, pp. 243902-1-243902-4.

F. Fu et al, "Low-temperature-processed efficient semi-transparent planar perovskite solar cells for bifacial and tandem applications,"Nature communications, vol. 6, 2015, pp. 1-9.

L. Kranz et al, "High-efficiency polycrystalline thin film tandem solar cells," The journal of physical chemistry letters, vol. 6, 2015, pp. 2676-2681.

F. Lang et al, "Perovskite solar cells with large-area CVD-graphene for tandem solar cells," The journal of physical chemistry letters, vol. 6, 2015, pp. 2745-2750.

J.P. Mailoa et al, "A 2-terminal perovskite/silicon multijunction solar cell enabled by a silicon tunnel junction," Applied Physics Letters, vol. 106, 2015, pp. 121105-1-121105-4.

J. Werner et al, "Sputtered rear electrode with broadband transparency for perovskite solar cells,"Sol. Energy Mater. Sol. Cells, vol. 141, 2015, pp. 407-413.

Y. Yang et al, "Multilayer transparent top electrode for solution processed perovskite/Cu (In, Ga)(Se, S) 2 four terminal tandem solar cells,"ACS nano, vol. 9, No. 7, 2015, pp. 7714-7721.

"Office Action of Taiwan Counterpart Application", dated May 19, 2020, p. 1-p. 11.

* cited by examiner

PEROVSKITE SOLAR CELL AND TANDEM SOLAR CELL

CROSS-REFERENCE TO RELATED APPLICATION

This application claims the priority benefit of Taiwan application no. 106143699 filed on Dec. 13, 2017. The entirety of the above-mentioned patent application is hereby incorporated by reference herein and made a part of this specification.

BACKGROUND

Technical Field

This disclosure is related to a perovskite solar cell and a tandem solar cell.

Description of Related Art

In recent years, due to environmental pollution caused by the global climate anomalies, the requirement of energy needed for sustainable cleanliness has rapidly gained the attention of all countries in the world. Solar energy is undoubtedly the largest source of carbon-free energy. A solar cell is a photoelectric conversion element that directly converts sunlight energy into electric energy.

The theoretical efficiency of nearly 40% can be achieved by tandem solar cell technology in which a semi-transmissive perovskite solar cell is utilized in combination with a silicon solar cell. However, the biggest problem with this semi-transmissive perovskite solar cell is that the light absorption of the transparent conductive layer is too large resulting in decrease of the light penetration into the bottom cell, and poor efficiency of the tandem solar cell is thus caused.

SUMMARY

According to an embodiment of this disclosure, a perovskite solar cell comprises a perovskite light-absorbing layer having a first surface and a second surface, a first electrode disposed on the first surface of the perovskite light-absorbing layer, and a second electrode disposed on the second surface of the perovskite light-absorbing layer. The first electrode includes a transparent electrode made of metal-doped molybdenum oxide, and the doped metal is niobium (Nb) or manganese (Mn).

According to another embodiment of this disclosure, a tandem solar cell comprises a first solar cell and a second solar cell. The first solar cell has a light-receiving surface and a non-light-receiving surface opposite to the light-receiving surface. The first solar cell is the perovskite solar cell as mentioned before, and the second solar cell is disposed on the non-light-receiving surface of the first solar cell.

Accordingly, in this disclosure, the Nb-doped or Mn-doped molybdenum oxide is used to replace the conventional transparent conductive oxide (e.g. ITO, AZO, etc.) in order to improve the light transmittance. Therefore, more long-wavelength light can penetrate into the second solar cell underneath, so as to improve the overall efficiency of the tandem solar cell.

The foregoing will become better understood from a careful reading of a detailed description provided herein below with appropriate reference to the accompanying drawings.

DESCRIPTION OF THE EMBODIMENTS

Figure 1:
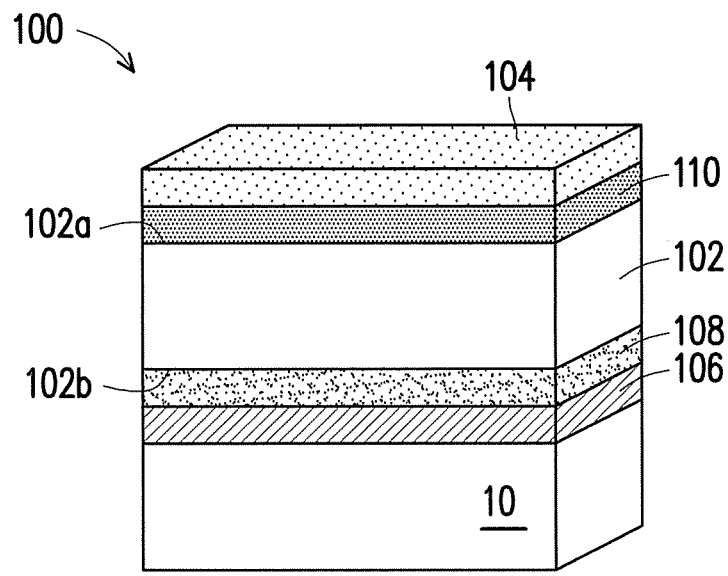
FIG. 1 is a three-dimensional schematic diagram of a perovskite solar cell according to a first embodiment of this disclosure.

Reference will now be made in detail to the present embodiments of the disclosure, examples of which are illustrated in the accompanying drawings. However, this disclosure may be practiced in many different forms and should not be construed to be limited to the embodiments.

The figures show general features of structures and/or materials in the embodiments. However, these should not be construed as defining or limiting the scope or nature of the embodiments. For example, the relative thicknesses and locations of layers, regions, and/or structures may be reduced or enlarged for clarity. In addition, in the drawings, similar or identical elements are used to represent similar or same elements or features. Therefore, the same reference numerals in the drawings denote the same elements and will not be redundantly described.

It will be understood that when a member is referred to as being "in contact" with another member, it may be in direct contact with other elements, or there may be an intermediate member. Conversely, when a member is said to be "in direct contact" with another member, there will be no intermediate member.

Also, although the terms "first", "second", etc. may be used herein to describe various members, regions, layers and/or sections, it should be understood that these members, regions, layers and/sections are not limited to these terms. Thus, a first member, region, layer or section discussed below could be termed as a second member, region, layer or section without departing from the teachings of the embodiments.

Also, spatially relative terms such as "below", "under," "above," or similar terms are used herein to simply describe a relationship of a component relative to another component. It is to be understood that the spatially relative terms also encompass different orientations of components in use or in operation beyond the orientation drawn in the drawings. For example, if the device in the scheme is reversed, the component described as "under" or "under" the other component will be turned to "on" to the other component.

FIG. 1 is a three-dimensional schematic diagram of a perovskite solar cell according to a first embodiment of this disclosure.

Please refer to FIG. 1. In the first embodiment, a perovskite solar cell 100 may be disposed on a substrate 10. The substrate 10 is not limited herein. The substrate 10 may be a glass substrate or a flexible plastic substrate. The perovskite solar cell 100 basically comprises a perovskite light-absorbing layer 102, a first electrode 104 and a second electrode 106. The first electrode 104 is disposed on a first surface 102a of the perovskite light-absorbing layer 102. The second electrode 106 is disposed on a second surface 102b of the perovskite light-absorbing layer 102. In this embodiment, the first electrode 104 comprises a transparent electrode made of metal-doped molybdenum oxide. The doped metal is niobium (Nb) or manganese (Mn), and the doped amount is 0.5-10 at. %. If niobium is doped, for example, the doped amount is about between 0.5 at. % and 10 at. %. If manganese is doped, for example, the doped amount is about between 0.5 at. % and 10 at. %. Nb has one more hole than Mo, and Mn has one more electron than Mo. Hence, both Nb and Mn can increase the carrier concentration in molybdenum oxide ($MoO_3$) so as to improve electrical conductivity of molybdenum oxide, and the molybdenum oxide can have both functions of an electron blocking layer and a conductive film. Therefore, the first electrode 104 of the first embodiment can replace the known multi-layered structure having an electron blocking layer and a transparent conductive layer to improve the light transmittance. The method of forming the first electrode 104 above may be, but is not limited to, (1) sputtering: a target made of $MoO_3$:Nb or $MoO_3$:Mn is sputtered to deposit a $MoO_3$ thin film doped with Nb or Mn; (2) reactive sputtering: a target made of Nb-doped Mo (Mo:Nb) or Mn-doped Mo (Mo:Mn) is sputtered while oxygen is introduced to deposit a $MoO_3$ thin film doped with Nb or Mn; (3) evaporation: powder of $MoO_3$:Nb or $MoO_3$:Mn is evaporated by heat or an electron gun to deposit a $MoO_3$ thin film doped with Nb or Mn. After the deposition by the above-mentioned various methods, post-annealing can be used to heat the deposited molybdenum oxide thin film doped with Nb or Mn to improve the crystallinity and conductivity of the thin film.

In FIG. 1, the perovskite light-absorbing layer 102 may be $AMX_3$, for example; M is $Ge^{2+}$, $Sn^{2+}$, or $Pb^{2+}$; A is methylammonium, ethylammonium, or formamidinium; and X is $F^-$, $Cl^-$, $Br^-$, or $I^-$. The second electrode 106 may be a metal electrode, such as a Mo electrode, or a transparent electrode, such as a transparent conductive oxide (TCO) electrode, Ag nanowire, or graphene. The TCO may comprises indium tin oxide (ITO), fluorine doped tin oxide (FTO), aluminium zinc oxide (AZO), or indium zinc oxide (IZO). In another embodiment, the second electrode 106 may be the same with the first electrode 104 to comprise a transparent $MoO_3$ thin film doped with Nb or Mn. The metal doped amount may be changed as required.

In the first embodiment, an electron transporting layer (ETL) 108 is disposed between the second surface 102b of the perovskite light-absorbing layer 102 and the second electrode 106. The material of the ETL 108 may be, but is not limited to, $PC_{61}BM/BCP$, $PC_{61}BM/TiOx$, $PC_{61}BM/LiF$, $PC_{61}BM/PFN$, $PC_{61}BM/C_{60}/BCP$, $PC_{61}BM/ZnO$, ZnO, $Al_2O_3$, or TiOx.

In the first embodiment, a hole transporting layer (HTL) 110 disposed between the first surface 102a of the perovskite light-absorbing layer 102 and the first electrode 104. The material of the HTL 110 may be, but is not limited to, PEDOT:PSS (poly(3,4-ethylenedioxythiophene):polystyrene sulfonate), PEDOT:PSS/Poly-TPD (poly(3,4-ethylenedioxythiophene):polystyrene sulfonate/Poly(N,N'-bis-4-butylphenyl-N,N'-bisphenyl)benzidine), PEDOT:PSS/PCDTBT (poly(3,4-ethylenedioxythiophene):polystyrene sulfonate/Poly[N-9'-heptadecanyl-2,7-carbazole-alt-5,5-(4',7'-di-2-thienyl-2',1',3'-benzothiadiazole)]), PTAA (Poly[bis(4-phenyl)(2,5,6-trimethylphenyl)amine]), NiOx, NiOx:Cu, or Spiro-OMeTAD (2,2',7,7'-tetrakis(N,N-di-p-methoxyphenyl-amine) 9,9'-spirobifluorene).

Figure 2:
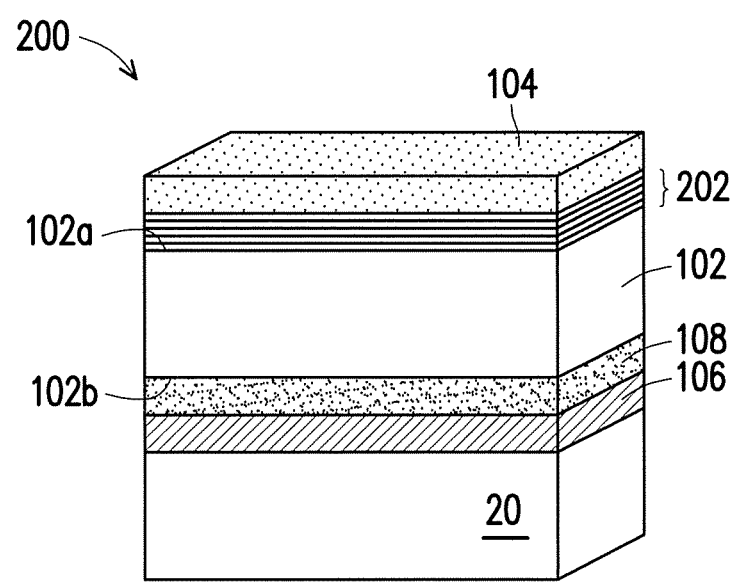
FIG. 2 is a three-dimensional schematic diagram of a perovskite solar cell according to a second embodiment of this disclosure.

FIG. 2 is a three-dimensional schematic diagram of a perovskite solar cell according to a second embodiment of this disclosure. The same reference numerals as the first embodiment are used to represent the same members.

In FIG. 2, a perovskite solar cell 200 is disposed on a substrate 20. Like the perovskite solar cell 100 of the first embodiment, the perovskite solar cell 200 comprises a perovskite light-absorbing layer 102, a first electrode 104, a second electrode 106, and an electron transporting layer 108. However, the hole transport layer 110 of the first embodiment is replaced by a $MoS_2$ hole transporting layer 202 disposed between the first surface 102a of the perovskite light-absorbing layer 102 and the first electrode 104. Accordingly, the first electrode 104 comprising the metal-doped $MoO_3$ thin film is in combination with the HTL 202 made of a two-dimensional $MoS_2$. Due to the excellent hole extraction rate of the two-dimensional $MoS_2$, the separation of the electrons and holes in the perovskite light absorption layer 102 can be accelerated to increase the electric current of the cell components. Since $MoS_2$ is an inorganic material, it has the opportunity to improve the conventional deterioration problems of hole transport materials commonly occurred in perovskite solar cells and thus improve the stability and longevity of perovskite solar cell materials.

In the second embodiment, the $MoS_2$ hole transporting layer 202 may be a single-layered film or a multi-layered film. If the $MoS_2$ hole transporting layer 202 is a single-layered film, the thickness thereof is about 0.7 nm. If the $MoS_2$ hole transporting layer 202 is a multi-layered film, the thickness thereof may be several nm to 150 nm and the thickness of each layer is about 0.7 nm. The substrate 20 is not limited, and may be a glass substrate or a flexible plastic substrate.

Figure 3:
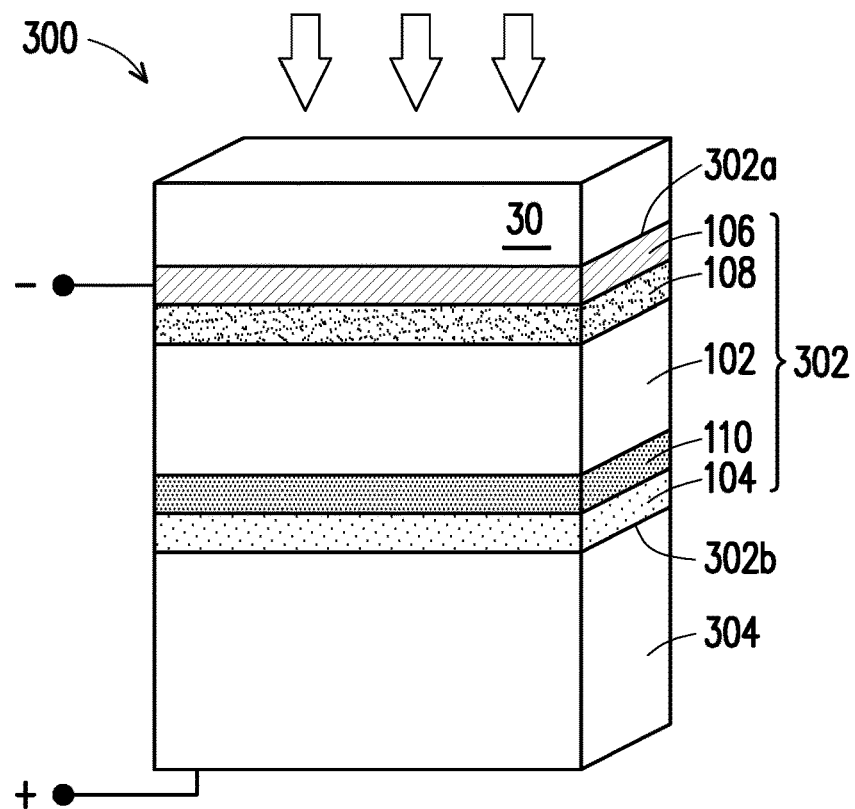
FIG. 3 is a three-dimensional schematic diagram of a tandem solar cell according to a third embodiment of this disclosure.

FIG. 3 is a three-dimensional schematic diagram of a tandem solar cell according to a third embodiment of this disclosure. The same reference numerals as the first embodiment are used to represent the same members.

Please refer to FIG. 3. The tandem solar cell 300 comprises a first solar cell 302 and a second solar cell 304. The first solar cell 302 has a light-receiving surface 302a and a non-light-receiving surface 302b opposite to the light-receiving surface 302a.

The first solar cell 302 is the perovskite solar cell of the embodiments above, which comprises a perovskite light-absorbing layer 102, a first electrode 104, a second electrode 106, an electron transporting layer 108, and a hole transporting layer 110, but this disclosure is not limited thereto. In the first solar cell 302, the electron transport layer 108 and/or the hole transport layer 110 may be omitted, or the hole transport layer 110 may be replaced by the $MoS_2$ hole transporting layer 202 of the second embodiment. Moreover, the substrate 30 may be disposed on the light-receiving surface 302a, and may be a glass substrate or a flexible plastic substrate.

The second solar cell 304 is disposed on the non-light-receiving surface 302b of the first solar cell 302. The second solar cell 304 may be a silicon-based solar cell, a silicon thin film solar cell, a III-V semiconductor solar cell, a II-VI semiconductor solar cell, or an organic semiconductor solar cell. In this embodiment, the first electrode 104 of the first solar cell 302 directly contact the second solar cell 304. Therefore, the tandem solar cell 300 of the third embodiment can be a 2T (two terminal) tandem solar cell by electrically matching.

Figure 4:
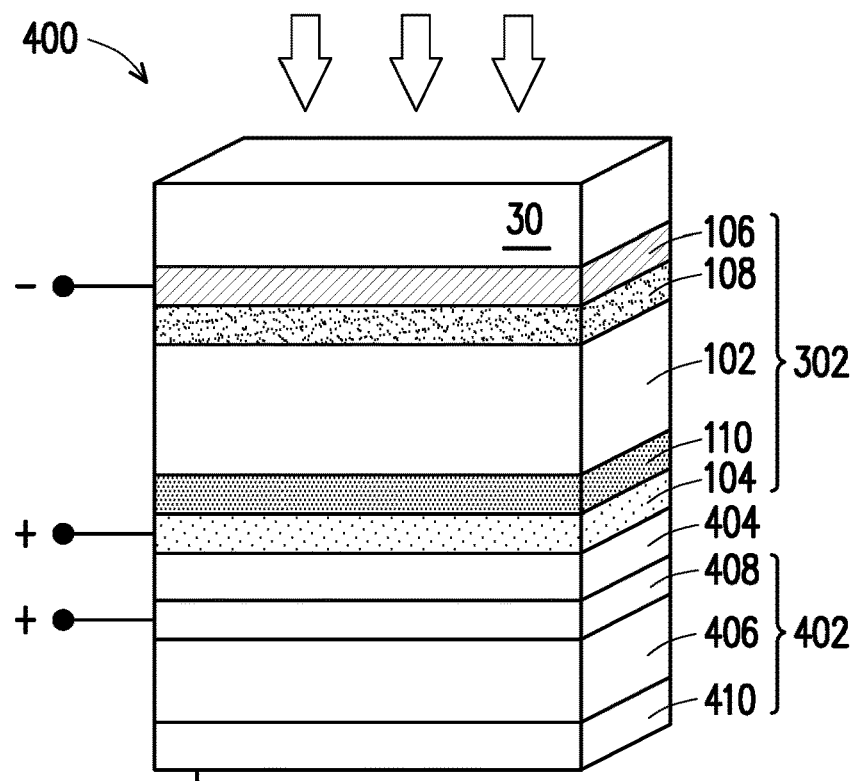
FIG. 4 is a three-dimensional schematic diagram of a tandem solar cell according to a fourth embodiment of this disclosure.

FIG. 4 is a three-dimensional schematic diagram of a tandem solar cell according to a fourth embodiment of this disclosure. The same reference numerals as the third embodiment are used to represent the same members.

In FIG. 4, the tandem solar cell 400 is a 4T (four terminal) tandem solar cell. Therefore, there is a middle layer 404 between the first solar cell 302 and the second solar cell 402 to separate the first solar cell 302 and the second solar cell 402. Therefore, the first solar cell 302 and the second solar cell 402 do not need to be electrically matched. The middle layer 404 may be a transparent adhesive, such as an optical clear adhesive (OCA), a silicone, or ethylene-vinyl acetate (EVA). The second solar cell 402 may be a silicon-based solar cell, a silicon thin film solar cell, a III-V semiconductor solar cell, a II-VI semiconductor solar cell, or an organic semiconductor solar cell. The second solar cell 402 basically comprises a light absorbing layer 406, a front contact 408, and a back contact 410. Therefore, the tandem solar cell 400 have four terminals of the first electrode 104, the second electrode 106, the front contact 408, and the back contact 410 for wiring.

Figure 5:
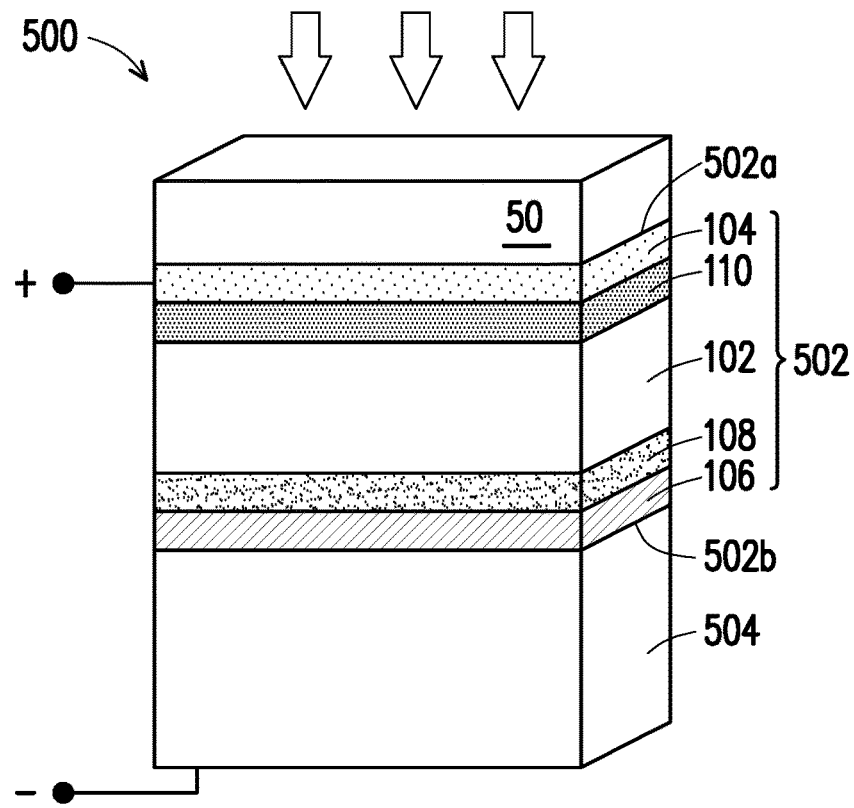
FIG. 5 is a three-dimensional schematic diagram of a tandem solar cell according to a fifth embodiment of this disclosure.

FIG. 5 is a three-dimensional schematic diagram of a tandem solar cell according to a fifth embodiment of this disclosure. The same reference numerals as the first embodiment are used to represent the same members.

Please refer to FIG. 5. The tandem solar cell 500 of the fifth embodiment comprises a first solar cell 502 and a second solar cell 504. The first solar cell 502 has a light-receiving surface 502a and a non-light-receiving surface 502b opposite to the light-receiving surface 502a. The second solar cell 504 is disposed on the non-light-receiving surface 502b of the first solar cell 502. In this embodiment, the second electrode 106 of the first solar cell 502 directly contacts the second solar cell 504. Therefore, the first electrode 104, which is made of transparent molybdenum oxide doped with metal, is close to the light receiving surface 502a of the first solar cell 502. The first solar cell 502 comprises a perovskite light-absorbing layer 102, a first electrode 104, a second electrode 106, an electron transporting layer 108, and a hole transporting layer 110, but this disclosure is not limited thereto. In the first solar cell 502, the electron transport layer 108 and/or the hole transport layer 110 may be omitted, or the hole transport layer 110 may be replaced by the MoS$_2$ hole transporting layer 202 of the second embodiment. Moreover, the substrate 50 may be disposed on the light-receiving surface 502a, and may be a glass substrate or a flexible plastic substrate. The second solar cell 504 may be a silicon-based solar cell, a silicon thin film solar cell, a III-V semiconductor solar cell, a II-VI semiconductor solar cell, or an organic semiconductor solar cell. The first solar cell 502 and the second solar cell 504 can be a 2T tandem solar cell by electrical matching.

Figure 6:
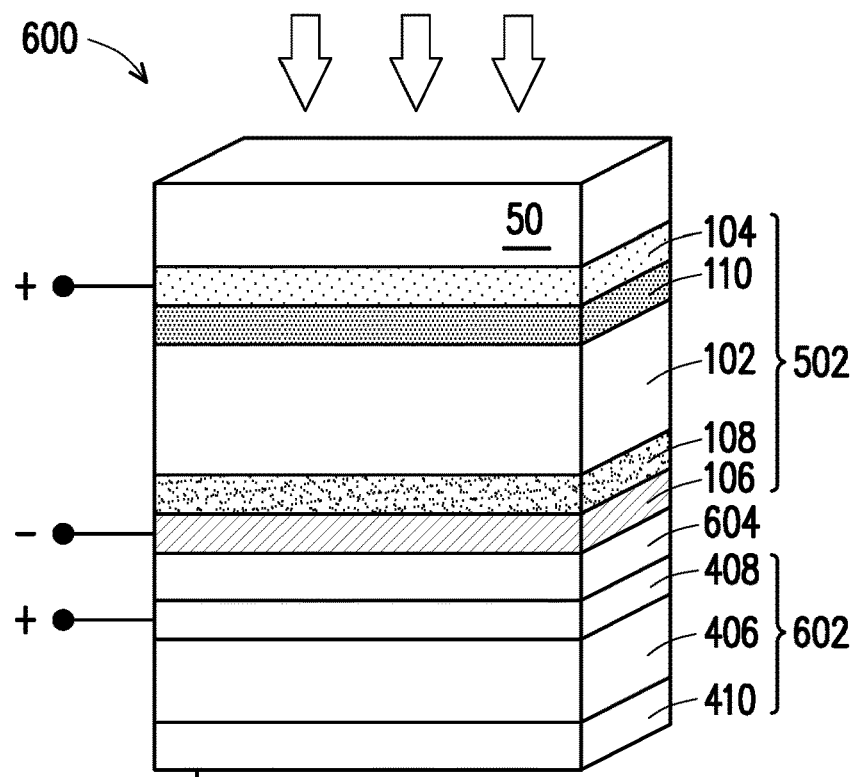
FIG. 6 is a three-dimensional schematic diagram of a tandem solar cell according to a sixth embodiment of this disclosure.

FIG. 6 is a three-dimensional schematic diagram of a tandem solar cell according to a sixth embodiment of this disclosure. The same reference numerals as the fifth embodiment are used to represent the same members.

In FIG. 6, the tandem solar cell 600 is a 4T tandem solar cell. There is a middle layer 604 between the first solar cell 502 and the second solar cell 602 to separate the first solar cell 502 and the second solar cell 602. Therefore, the first solar cell 502 and the second solar cell 602 do not need to be electrically matched. The second solar cell 602 may be a silicon-based solar cell, a silicon thin film solar cell, a III-V semiconductor solar cell, a II-VI semiconductor solar cell, or an organic semiconductor solar cell. The second solar cell 602 basically comprises a light absorbing layer 606, a front contact 608, and a back contact 610. Therefore, the tandem solar cell 600 have four terminals of the first electrode 104, the second electrode 106, the front contact 608, and the back contact 610 for wiring.

The following experiments were conducted to verify the characteristics of the metal-doped molybdenum oxide transparent electrode of the present disclosure. However, the present disclosure is not limited to the following experiments.

EXAMPLE 1

First, two targets (one Mo target and one Mn target) are used. Oxygen is introduced to deposit a molybdenum oxide film on a substrate by reactive sputtering. Next, the oxygen supply was stopped to deposit a manganese film. Then, oxygen is re-introduced to deposit another molybdenum oxide film. After the deposition, a post-annealing is performed to heat the three films at a temperature of 100-300° C. to obtain a Mn-doped molybdenum oxide film with a thickness of 50-70 nm, and the Mn doped amount is 0.5-10 at. %.

EXAMPLE 2

In the same manner as in Example 1 except that the Mn target was changed to a Nb target, a Nb-doped molybdenum oxide film having a thickness of about 50 nm to 70 nm is deposited. The Nb doped amount is 0.5-10 at. %.

COMPARATIVE EXAMPLE 1

An indium tin oxide (ITO) film with a thickness of 50-70 nm is deposited by sputtering.

COMPARATIVE EXAMPLE 2

An aluminium zinc oxide (AZO) film with a thickness of 50-70 nm is deposited by sputtering.

COMPARATIVE EXAMPLE 3

A molybdenum oxide with a thickness of 50-70 nm and an ITO film with a thickness of 50-70 nm are deposited by sputtering.

COMPARATIVE EXAMPLE 4

A molybdenum oxide with a thickness of 50-70 mm and an AZO film with a thickness of 50-70 nm are deposited by sputtering.

Figure 7:
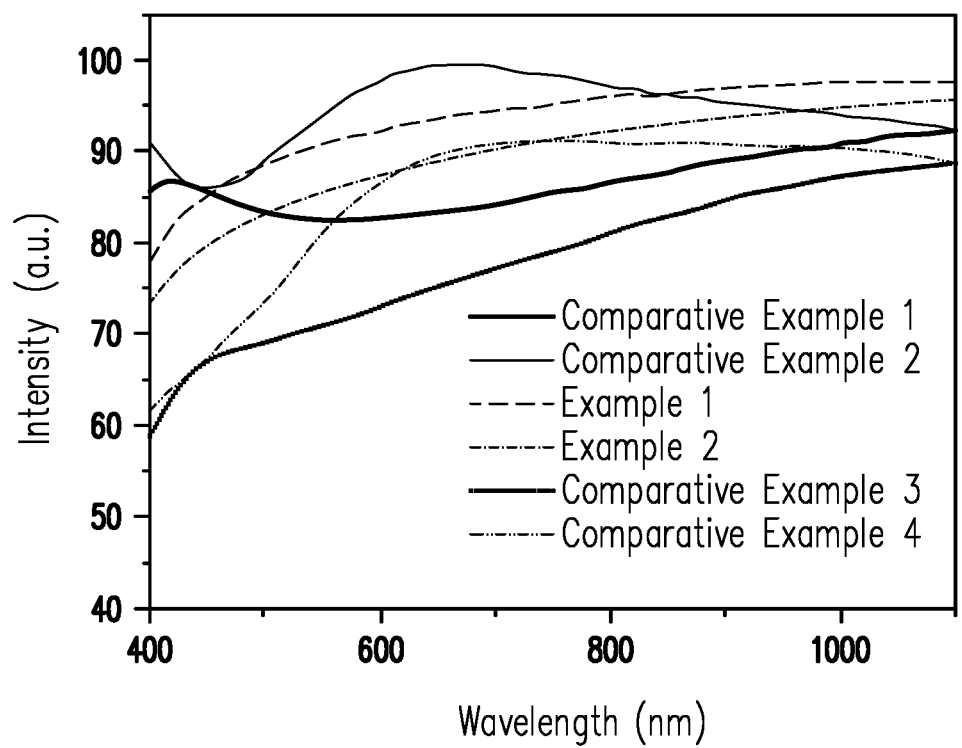
FIG. 7 is an optical characteristics diagram of examples and comparative examples.

The UV-visible spectra of the examples and comparative examples above are measured, and the results are shown in FIG. 7.

From FIG. 7, it can be known that the transmittance of Examples 1-2 in the long wavelength (800-1200 nm) region is higher than the transmittance of Comparative examples 3-4 in the same region. Therefore, the Mn-doped or Nb-doped molybdenum oxide films of Examples 1-2, as applied to the upper cell (the perovskite solar cell) of a tandem solar cell, should allow more long-wavelength light to penetrate into the bottom cell and increase the efficiency of the tandem solar cell.

In light of the forging, this disclosure uses the Mn-doped or Nb-doped molybdenum oxide films to replace the conventional transparent conductive oxide films, so that the Mn-doped or Nb-doped molybdenum oxide films can have the functions of an electron blocking layer and a conductive film to improve the light transmittance. When the Mn-doped or Nb-doped molybdenum oxide films are applied on tandem solar cells, more long-wavelength light can penetrate into the bottom solar cells of the tandem solar cells to increase the efficiency of the tandem solar cells. Moreover, if the above-mentioned Nb-doped or Mn-doped molybdenum oxide and the two-dimensional $MoS_2$, as the HTL, are used together, the separation of the electron and holes can be accelerated in the perovskite light absorbing layer to increase the electric current of the cell components. The above layers are inorganic materials, which can improve the commonly used problems of deterioration of the hole transporting material and further improve the stability and the longevity of the perovskite solar cell materials.

It will be apparent to those skilled in the art that various modifications and variations can be made to the disclosed embodiments without departing from the scope or spirit of the disclosure. It is intended that the specification and examples be considered as exemplars only, with a true scape of the disclosure being indicated by the following claims and their equivalents.

What is claimed is:

1. A perovskite solar cell comprising:
    a perovskite light-absorbing layer having a first surface and a second surface;
    a first electrode disposed on the first surface of the perovskite light-absorbing layer, wherein the first electrode is a transparent single-layered electrode, and the first electrode is consisted of niobium-doped molybdenum oxide ($MoO_3$); and
    a second electrode disposed on the second surface of the perovskite light-absorbing layer.

2. The perovskite solar cell of claim 1, wherein a doped amount of niobium is 0.5-10 at. %.

3. The perovskite solar cell of claim 2, wherein the second electrode comprises a metal electrode or a transparent conductive oxide (TCO) electrode.

4. The perovskite solar cell of claim 1, wherein the perovskite light-absorbing layer is $AMX_3$; M is $Ge^{2+}$, $Sn^{2+}$, or $Pb^{2+}$; A is methylammonium, ethylammonium, or formamidinium; and X is $F^-$, $Cl^-$, $Br^-$, or $I^-$.

5. The perovskite solar cell of claim 1, further comprising an electron transporting layer (ETL) disposed between the second surface of the perovskite light-absorbing layer and the second electrode.

6. The perovskite solar cell of claim 5, wherein the ETL comprises $PC_{61}BM/BCP$, $PC_{61}BM/TiOx$, $PC_{61}BM/LiF$, $PC_{61}BM/PFN$, $PC_{61}BM/C_{60}/BCP$, $PC_{61}BM/ZnO$, ZnO, $Al_2O_3$, or TiOx.

7. The perovskite solar cell of claim 1, further comprising a hole transporting layer (HTL) disposed between the first surface of the perovskite light-absorbing layer and the first electrode.

8. The perovskite solar cell of claim 7, wherein the HTL comprises $MoS_2$.

9. The perovskite solar cell of claim 7, wherein the HTL comprises PEDOT:PSS, PEDOT:PSS/Poly-TPD, PEDOT:PSS/PCDTBT, PTAA, NiOx, NiOx:Cu, or Spiro-OMeTAD.

10. A tandem solar cell, comprising:
    a first solar cell having a light-receiving surface and a non-light-receiving surface opposite to the light-receiving surface, wherein the first solar cell comprises:
        a perovskite light-absorbing layer having a first surface and a second surface;
        a first electrode disposed on the first surface of the perovskite light-absorbing layer, wherein the first electrode is a transparent single-layered electrode, and the first electrode is consisted of niobium-doped molybdenum oxide ($MoO_3$); and
        a second electrode disposed on the second surface of the perovskite light-absorbing layer; and
    a second solar cell disposed on the non-light-receiving surface of the first solar cell.

11. The tandem solar cell of claim 10, wherein the second solar cell comprises a silicon-based solar cell, a silicon thin film solar cell, a III-V semiconductor solar cell, a II-VI semiconductor solar cell, or an organic semiconductor solar cell.

12. The tandem solar cell of claim 10, wherein the first electrode of the first solar cell is in contact with the second solar cell.

13. The tandem solar cell of claim 10, wherein the second electrode of the first solar cell is in contact with the second solar cell.

14. The tandem solar cell of claim 10, further comprising a middle layer disposed between the first solar cell and the second solar cell.

15. The tandem solar cell of claim 10, wherein a doped amount of niobium is 0.5-10 at. %.

16. The tandem solar cell of claim 10, wherein the second electrode comprises a metal electrode or a transparent conductive oxide (TCO) electrode.

17. The tandem solar cell of claim 10, wherein the perovskite light-absorbing layer is $AMX_3$; M is $Ge^{2+}$, $Sn^{2+}$ or $Pb^{2+}$; A is methylammonium, ethylammonium, or formamidinium; and X is $F^-$, $Cl^-$, $Br^-$, or $I^-$.

18. The tandem solar cell of claim 10, further comprising an electron transporting layer (ETL) disposed between the second surface of the perovskite light-absorbing layer and the second electrode.

19. The tandem solar cell of claim 18, wherein the ETL comprises $PC_{61}BM/BCP$, $PC_{61}BM/TiOx$, $PC_{61}BM/LiF$, $PC_{61}BM/PFN$, $PC_{61}BM/C_{60}/BCP$, $PC_{61}BM/ZnO$, ZnO, $Al_2O_3$, or TiOx.

20. The tandem solar cell of claim 10, further comprising a hole transporting layer (HTL) disposed between the first surface of the perovskite light-absorbing layer and the first electrode.

21. The tandem solar cell of claim 20, wherein the HTL comprises $MoS_2$.

22. The tandem solar cell of claim 20, wherein the HTL comprises PEDOT:PSS, PEDOT:PSS/Poly-TPD, PEDOT:PSS/PCDTBT, PTAA, NiOx, NiOx:Cu, or Spiro-OMeTAD.

* * * * *